(12) United States Patent
Chang

(10) Patent No.: US 7,291,792 B2
(45) Date of Patent: Nov. 6, 2007

(54) SHIELDING MEMBER

(75) Inventor: Lin-Wei Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/395,069

(22) Filed: Mar. 30, 2006

(65) Prior Publication Data

US 2007/0114059 A1 May 24, 2007

(30) Foreign Application Priority Data

Nov. 18, 2005 (TW) .............................. 94219995 U

(51) Int. Cl.
*H05K 9/00* (2006.01)
(52) U.S. Cl. ...................... 174/382; 361/686
(58) Field of Classification Search ................ 174/377, 174/382; 361/686, 818, 800
See application file for complete search history.

(56) References Cited

U.S. PATENT DOCUMENTS 5,808,237 A * 9/1998 Hancock ..................... 174/378
7,110,253 B2 * 9/2006 Fan ............................. 361/686

* cited by examiner

*Primary Examiner*—Hung V. Ngo
(74) *Attorney, Agent, or Firm*—Peter F. Corless; Steven M. Jensen; Edwards Angell Palmer & Dodge LLP

(57) ABSTRACT

A shielding member is proposed for shielding an opening on a side of a server cabinet, the opening being adjacently connected to a base panel of a server cabinet, wherein the server cabinet includes a first positioning portion corresponding to the opening. The shielding member includes: a body, which is dimensioned to cover the opening; an operational portion formed on the body to correspond to a side of the back panel of the server cabinet, wherein the operational portion is formed with a second positioning portion corresponding to the first positioning portion; and a combining portion formed on the body and away from the side of the base panel of the server cabinet, for being combined with the side of the opening away from the base panel, so as to effectively and conveniently shield the opening adjacently connected with the base panel of the server.

8 Claims, 8 Drawing Sheets

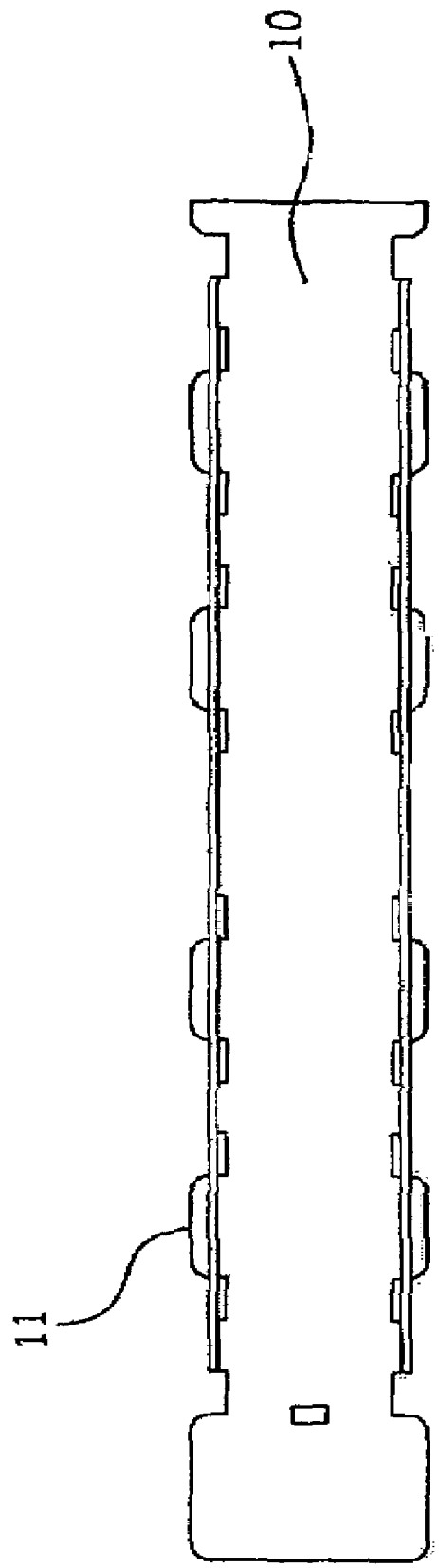
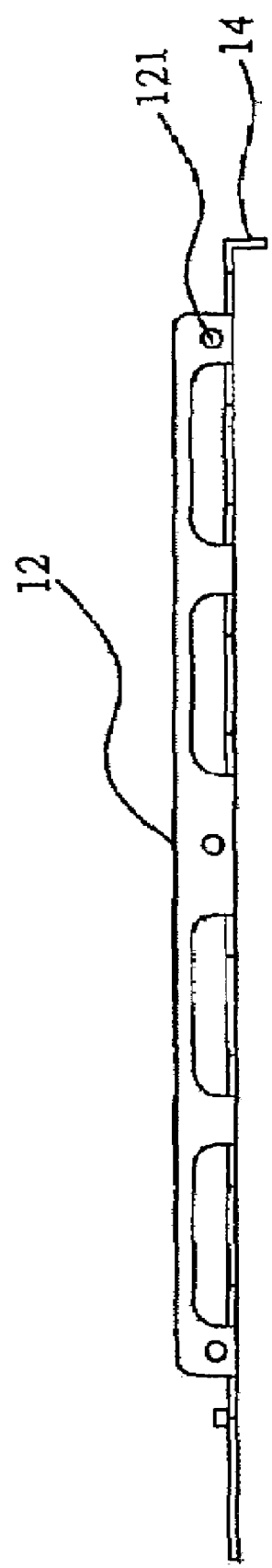
FIG. 1A (PRIOR ART)
FIG. 1B (PRIOR ART)

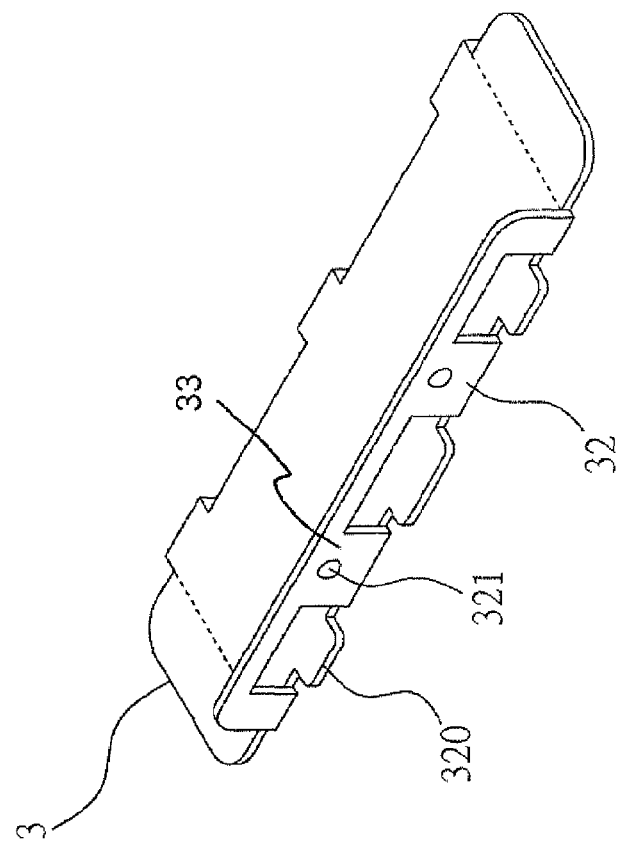
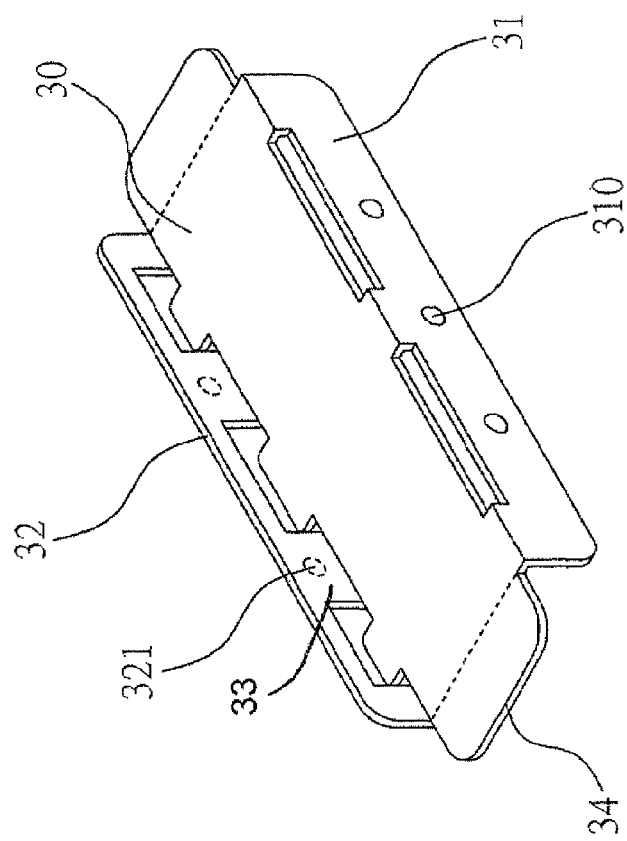
FIG. 4B
FIG. 4A

SHIELDING MEMBER

FIELD OF THE INVENTION

This invention relates to shielding members, and more particularly, to a shielding member for shielding an opening adjacently connected to a base panel of an electronic equipment cabinet.

BACKGROUND OF THE INVENTION

Industrial servers carry out various functions that are hard to predict when they are initially assembled and configured. As such, the design of servers usually includes reserved space and interface circuitry in order to accommodate further expansion such a standard product can meet the requirements of most expansion scenarios. In different technical fields, servers fulfill different purposes according to the applications. In order to increase the usage life and maximize usage, it is typical to reserve space in a server for electrical connections and installation of circuit boards having I/O functions, as well as a corresponding openings adapted for the connection bus to expose I/O contacts therefrom.

Typically the backside of a server cabinet has reserved slots for connecting to one side of an integrally formed shielding panel. When an additional circuit board needs to be installed therein to connect to the exposed I/O contacts, the shielding panel can be repeatedly folded back and forth to break it off so as to detach the shielding panel therefrom. However, if the circuit board is subsequently removed, the opening for exposing I/O connectors becomes unprotected and thus requires a shielding member to reduce the influence of electromagnet interference and to help keep dust out.

There are two different kinds of openings that are often used on the backsides of servers. One is formed in a central region of a back panel and the other is adjacently connected to a base panel of the machine cabinet. For servers having relatively thinner cabinets, the opening of the latter construction is generally adopted.

Referring to FIGS. 1A through 1D, a conventional shielding member for shielding an idle slot available for the insertion of PCI card is illustrated. The rectangle-shaped shielding member 1 is composed of a thin strip body 10, a plurality of blocking portions 11 protrudingly-formed along the two long corresponding sides of the body 10, a pressing member 12 bent along the same direction as the long side, the pressing member 12 being further provided with a plurality of protrusions 121 thereon. The shielding member 1 further includes bumps 13 formed respectively on each short side and an operational portion 14 perpendicularly folded up onto the body 10 in an opposite direction of the bumps 13.

In applying the shielding member 1 to shield an opening formed after the removal of an expansion card, first and preferably use both hands to hold two ends of the shielding member 1 from the exterior of the server cabinet, then push the pressing member 12 into the opening (not shown) until it is blocked by a blocking portion 11, and, at the same time, the bump 13 is also fastened to one side of the opening while the operational portion 14 is pushed to abut against the other side of the opening that is fastened with the bump 13, such that the blocking portions 11 and the protrusions 121 restrict the movement of the shielding member 1 towards in or outside of the server, whereas the operational portion 14 and the bumps 13 restrict the movement of the shielding member 1 on the lateral sides or towards the left and right hand sides, thereby fastening the shielding member 1 to the unused opening to protect it from outside contaminants.

While the shielding member can protect the unused opening from outside contaminants, it is necessary to bend or eliminate the shielding members from one long side when the shielding member is used to shield one side of the base panel of a server cabinet. Although the sides thereof are constituted to have a plurality of bumps, the base panel of a server cabinet does not have corresponding positioning structures, adversely affecting the stability after installation.

Also, in that the shielding member is generally constituted to match and cover the opening, when the opening is small, it is possible to install the shielding member with only one hand, but when the opening is big, the installation requires both hands to exert force evenly on both sides to accomplish installation, which is troublesome to apply.

Further, while one may pull the operational portion outward to remove the shielding member, the structure is rather small to be held firmly, and if the length of the operational portion is added, it is likely to protrude from the backside of the server, thereby causing inconvenience in disassembly.

Therefore, a need exists for an improved shielding structure that can be easily and conveniently used for shielding an opening of the backside of a server without difficulty.

SUMMARY OF THE INVENTION

In view of the foregoing drawbacks, a primary objective of this invention is to provide a shielding structure that can be rapidly and conveniently connected to a base panel of a server cabinet to facilitate installation and removal therefrom.

Another objective of this invention is to provide a shielding structure that has a simple structure so as to be easily installed in and removed from an opening on a backside of a server cabinet.

In accordance with the foregoing and other objectives, the present invention discloses a shielding member which is adapted to shield an opening on a side of a server cabinet, the opening being adjacently connected to a base panel of a server cabinet, wherein the server cabinet includes a first positioning portion corresponding to the opening, the shielding member comprising: a body which is dimensioned to cover the opening; an operational portion formed on the body to correspond to a side of the back panel of the server cabinet, wherein the operational portion is formed with a second positioning portion corresponding to the first positioning portion; and a combining portion formed on the body and being constituted to be away from the side of the base panel of the server cabinet, such that the combining portion can be combined with a side of the opening away from the base panel of the server cabinet.

Preferably, the first positioning portion is concave-shaped and the operational portion is perpendicularly folded up onto the shielding body, whereas the second positioning portion is convex-shaped formed to match with the first positioning portion.

The installation of the shielding member comprises the steps of: first holding the operational portion from the outside of the opening to contact the combining portion at an appropriate angle with the side of the opening that is away from the base panel of the server cabinet, then pivotally turning the shielding member towards the direction of the opening using the contact point as an axis, and finally fastening the first positioning portion to the corresponding second positioning portion to complete installation.

Conversely, in disassembly the shielding member it requires only pressing the operational portion to move it outwardly to detach the first positioning portion from the second positioning portion.

Compared to prior shielding members which are known to cause inconvenience in disassembly from the backside of a server, the shielding member of the present invention requires only single-hand operation by turning the shielding member, saving time for installation and being more reliable as well.

BRIEF DESCRIPTION OF DRAWINGS

The invention can be more fully understood by reading the following detailed description of a preferred embodiment, with reference made to the accompanying drawings, wherein:

FIGS. 1A to 1D (PRIOR ART) are schematic views showing the conventional structure of prior-art shielding members from different angles;

FIGS. 4A and 4B are perspective cross-sectional views showing detail of the shielding member according to the present invention.

DETAILED DESCRIPTION OF A PREFERRED EMBODIMENT

These and other objects and advantages of the present invention will become more fully apparent from the following detailed description when read in conjunction with the accompanying drawings. Also note that all of the ensuing drawings in this specification are simplified schematic diagrams to show only those parts related to the invention.

Figures 1C, 1D:
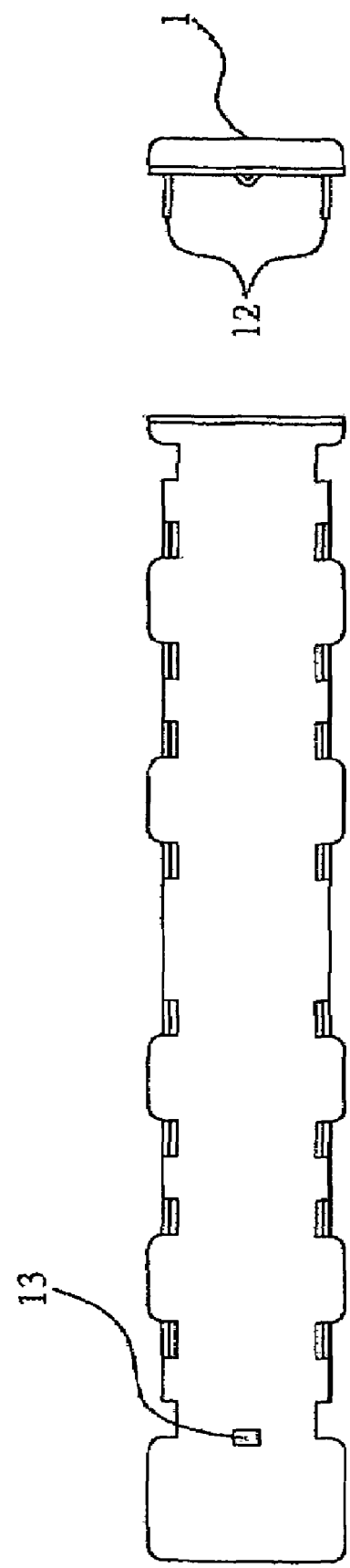
Figure 2:
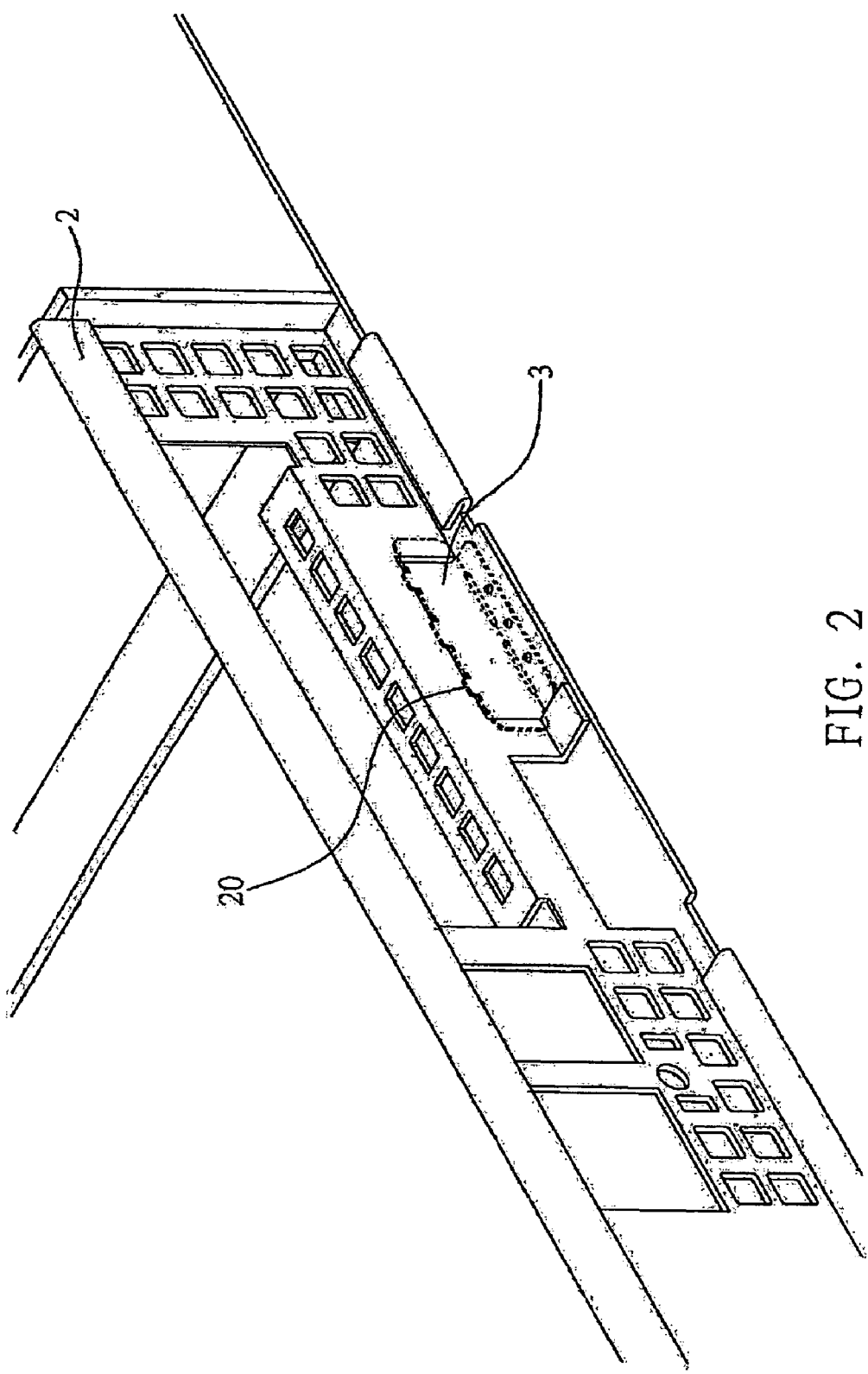
FIG. 2 is a schematic view showing a first preferred embodiment of the shielding member according to the present invention.

FIG. 2 shows a first preferred embodiment of the shielding member of the present invention. An opening 20 is formed on the backside of a server cabinet 2, and a shielding member 3 (shown in phantom-outline) for covering the opening 20 is formed to combine with the peripheral structures of the opening 20. Note that the size of the shielding member varies to match the opening 20 and is not limited to that illustrated.

Figure 3:
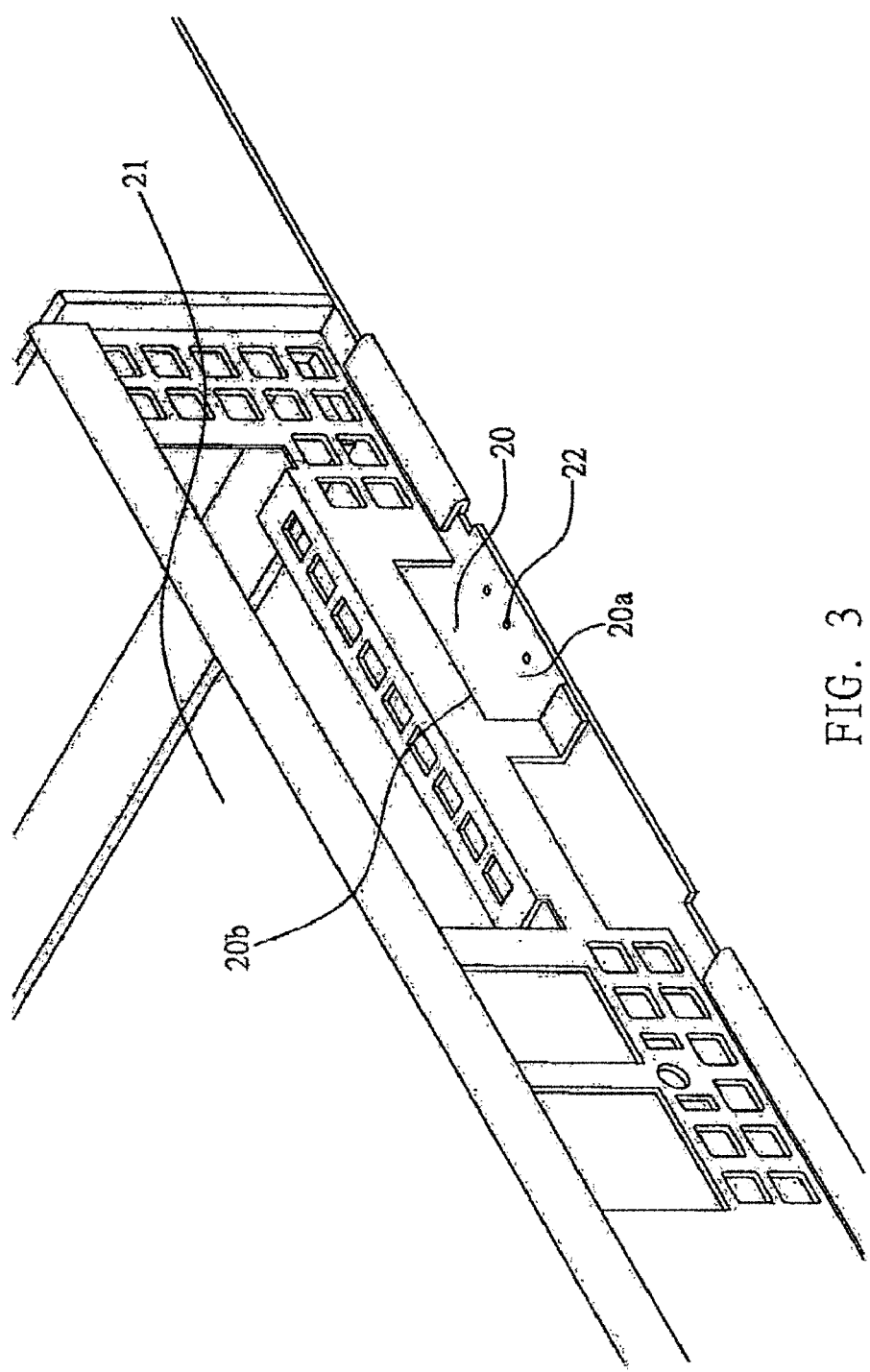
FIG. 3 is a schematic view showing the structure of the opening formed on the backside of the server cabinet and the peripheral thereof.

FIG. 3 illustrates the structure of the opening 20 formed on the backside of the server cabinet 2 and the peripheral thereof. The opening 20 is adjacently connected to the server base panel 21, the server base panel 21 comprising a first positioning portion 22 formed at position corresponding to the opening 20, and the first positioning portion 22 is in the form of a recess disposed on the server base panel 21.

FIGS. 4A and 4B are structural diagrams of the shielding member 3, showing that the body 30 of the rectangle-shaped shielding member 3 is formed to match the size and shape of the opening 20, wherein each side of the body 30 comprises an operational portion 31 and a combining portion 32. The operational portion 31 is a thin strip that perpendicularly connects to the bottom surface of the body 30 when assembled, and further comprises a second positioning portion 310 formed at position corresponding to the first positioning portion 22 and may be in the form of a convex protrusion. The combining portion 32 is disposed on the opening 20 and away from one side of the server base panel 21, and comprises a first blocking portion 320 extending from the body 30 in the form of a thin strip; and third positioning portions 321 intermittently disposed between the first blocking portion 320, wherein the third positioning portions 321 are perpendicularly connected to the top of the body 30 in the form of convex protrusions to be inserted into a pressing strip 33 (not shown) of the opening 20. In other words, the combining portion 32 is a room formed between the first blocking portion 320 and the third positioning portion 321. Note that the form of the first positioning portion 22 and the second positioning portion 310 may vary and are not limited to that described and illustrated. For example, the first positioning portion 22 may be a convex member and the second positioning portion 310 may be a corresponding concave member. The combining portion 32 is economically constituted and not limited to the form or shape disclosed herewith.

The two ends of the shielding member 3 each further respectively include a second blocking portion 34 extending outwardly from the body, also in the form of a thin strip.

FIGS. 5A to 5D depict the process of installing and disassembling the shielding member of the present invention to and from an opening on the backside of a server.

Figure 5B:
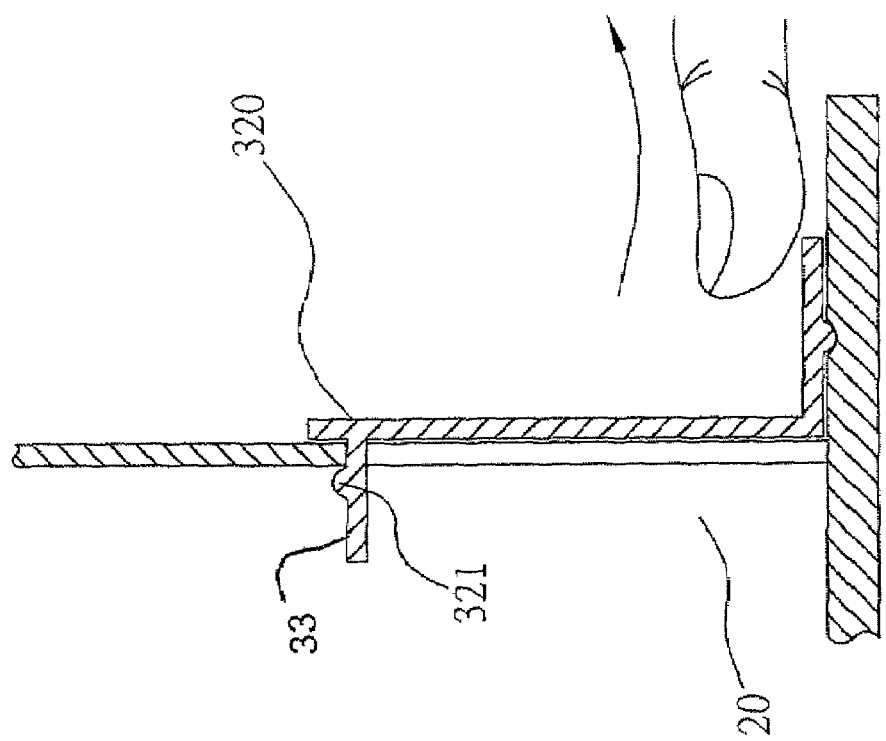
FIGS. 5A to 5D are sectional views showing the process of installing and disassembling the shielding member of the present invention into and from an opening on the backside of a server.
Figure 5A:
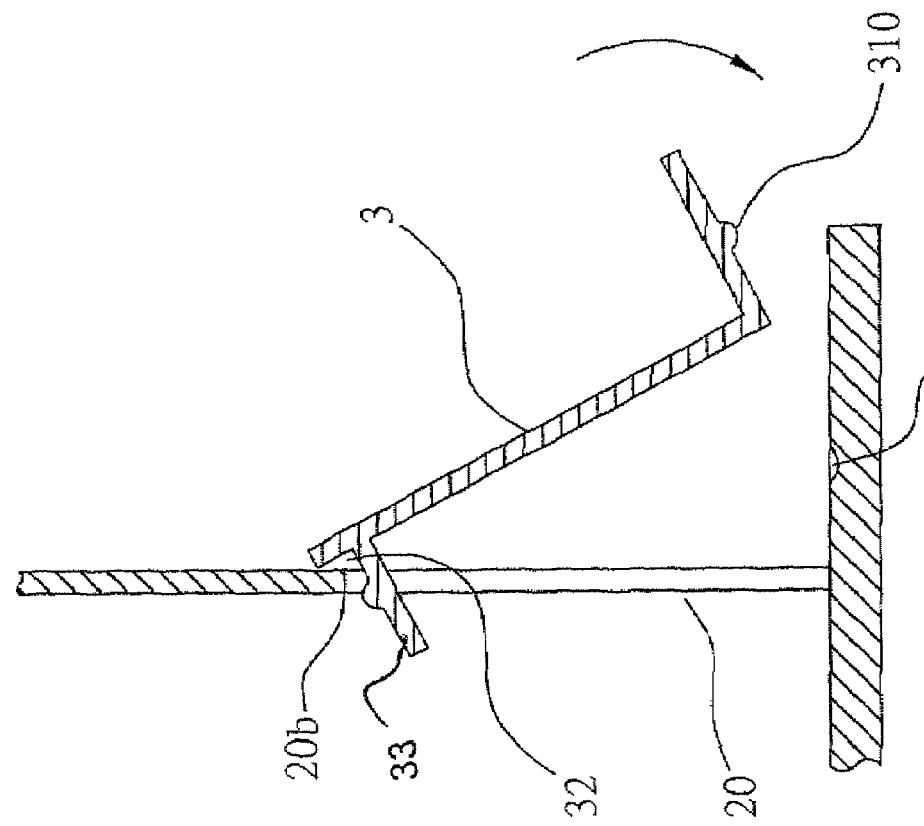

As shown in FIGS. 5A and 5B, first the operational portion 31 is held from outside of the opening 20 to contact the combining portion 32 at an appropriate angle with a second side 32b (not shown) of the opening 20 that is away from the base panel of the server cabinet, then, the shielding member 3 is pivotally turned in the direction of the opening 20 using the contact point of the combining portion 32 with the second side 32b as an axis to combine the combining portion 32 with the second side 32b, and the first positioning portion 22 is positioned on the second positioning portion 310. At this time, the first blocking portion 320 and the second blocking portion 34 respectively abut against the side thereof and the other sides adjacently connected to the casing body of the server. The combining portion 32 is embedded into the second side 32b to further restrict the movement of the combining portion 32, and, when disassembling the shielding member 3, removal only requires pressing the operational portion 31 to move outwardly to detach the second positioning portion 310 from the first positioning portion 22.

Figure 5C:
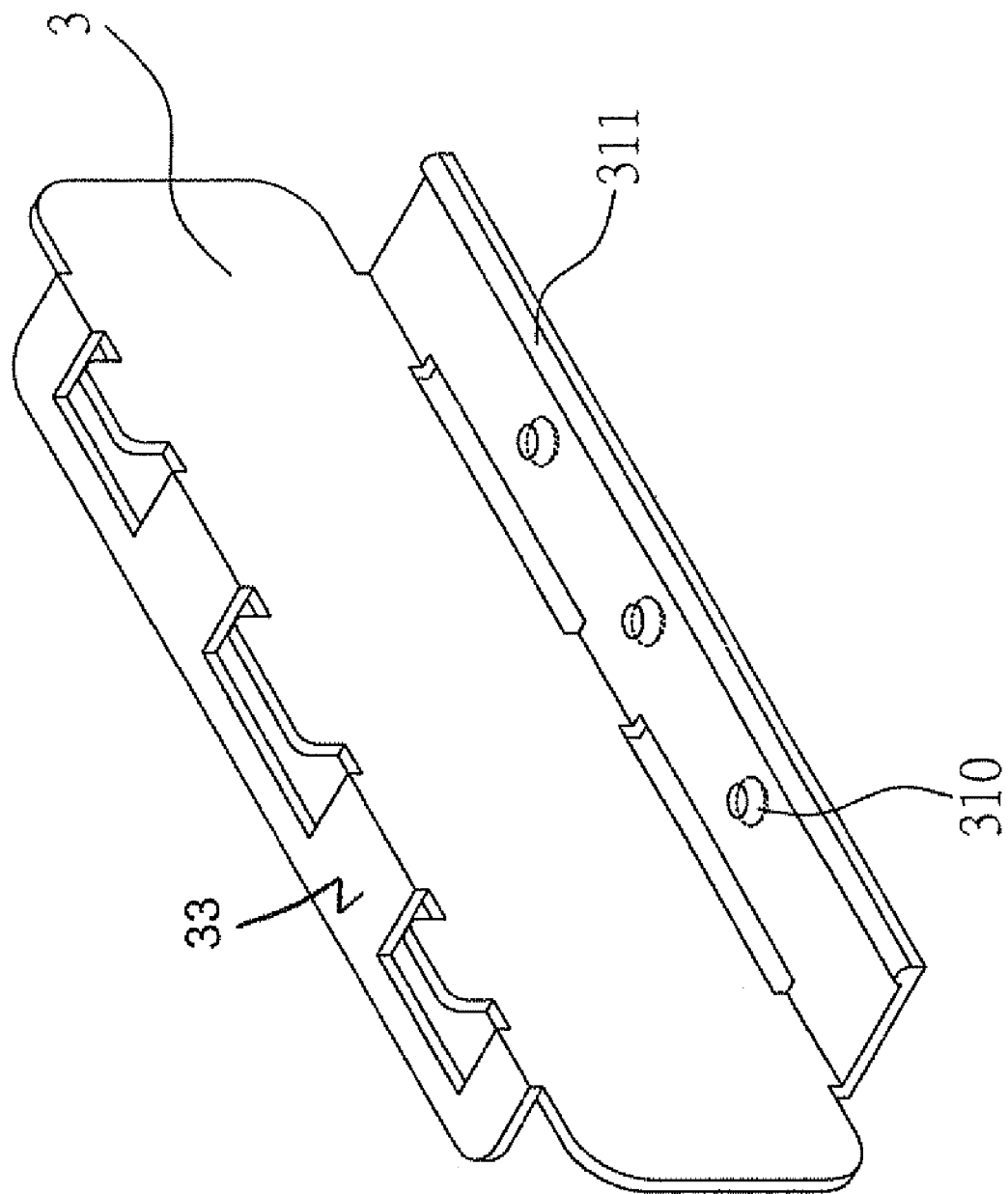

As shown in FIG. 5C, the shielding member 3 further includes a blocking flange 311 formed at the edge of the operational portion 31 away from the body 30, facilitating a user to disassemble the shielding member 3 from the opening 20.

Figure 5D:
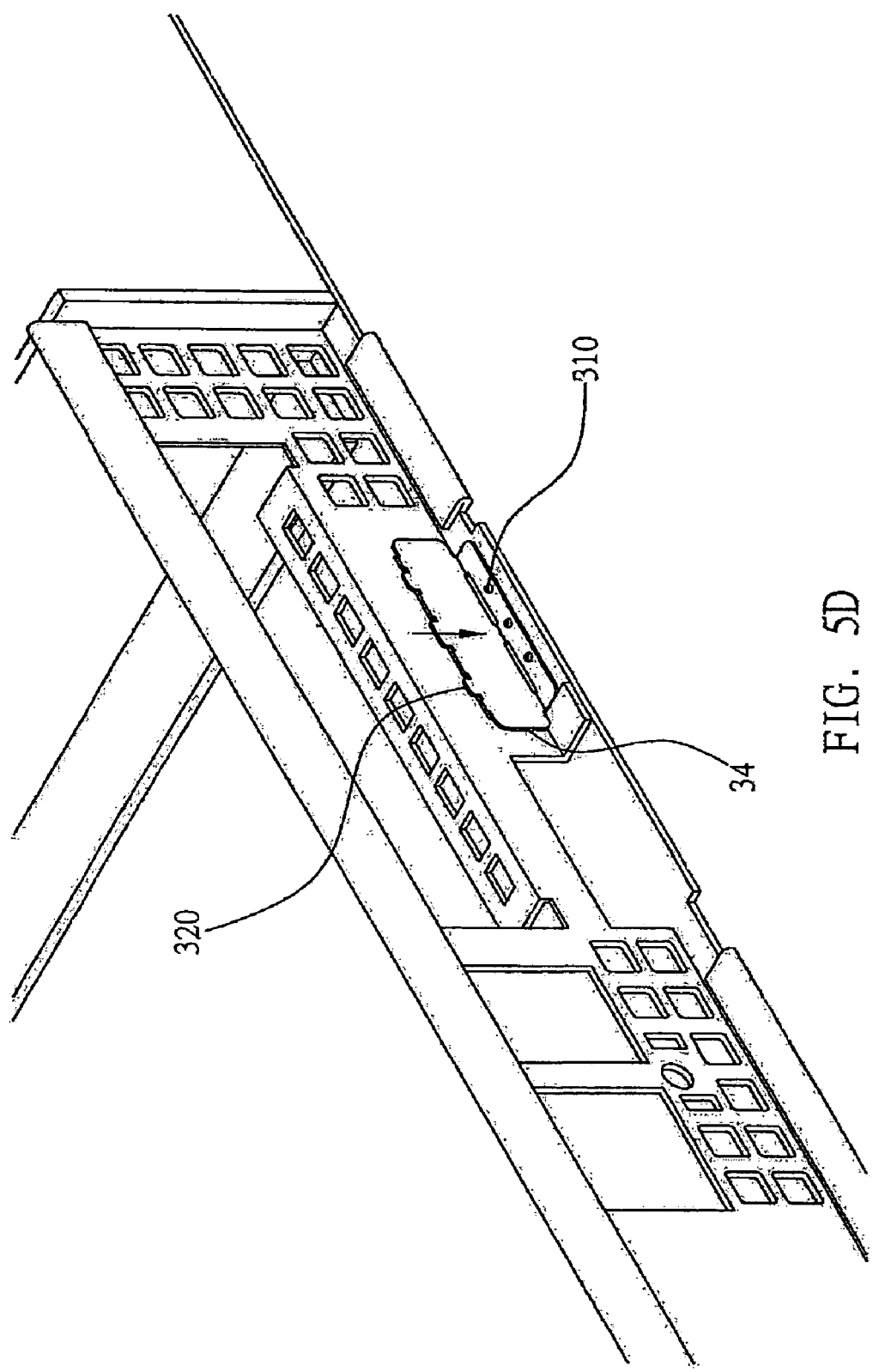

FIG. 5D is a sectional view showing the complete installation of the shielding member 3 into the opening 20.

As can be seen from this embodiment, when an opening on the backside of a server cabinet is constituted to adjacently connect to the server base panel, the shielding member of the present invention can be employed to effectively cover the opening as required and desired.

The shielding member of the present invention uses one end thereof to serve as an axis to turn the other end all the way down, as opposed to prior techniques that require both hands to exert force evenly in order to balance both ends in installation as well as in disassembly, effectively simplifying the process of installation and increasing convenience as a result. In addition, the design provides a clear and stable installation to save time and to simplify application.

Summarizing the above, the design offer several advantages in that it is simple, easy, and convenient to install as well as remove, and also has been proven to reduce dust and electromagnetic interference, and thus has high industrial applicability.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A shielding member for shielding an opening on a side of a server cabinet, the opening being adjacently connected to a base panel of the server cabinet, wherein the server cabinet includes a first positioning portion corresponding to the opening, the shielding member comprising:
   a body for covering the opening;
   an operational portion formed on the body and corresponding to a side of the base panel of the server cabinet, wherein the operational portion is formed with a second positioning portion corresponding to the first positioning portion; and
   a combining portion formed on the body and away from the side of the base panel of the server cabinet, for being combined with a side of the opening away from the base panel of the server cabinet, the combining portion comprising a pressing member perpendicularly connected to a top portion of the body and embedded into the opening.

2. The shielding member of claim 1, wherein the first positioning portion is concave-shaped and the second positioning portion is convex-shaped.

3. The shielding member of claim 1, wherein the first positioning portion is convex-shaped and the second positioning portion is concave-shaped.

4. The shielding member of claim 1, wherein the operational portion is perpendicularly connected to a bottom portion of the body.

5. The shielding member of claim 1, wherein the combining portion further comprises a first blocking portion and a third positioning portion that is formed on the pressing member.

6. The shielding member of claim 5, wherein the third positioning portion is convex-shaped and the first blocking portion is a thin strip connected in parallel with the body, such that a room is formed between the third positioning portion and the first blocking portion.

7. The shielding member of claim 1, further comprising second blocking portions respectively formed on opposite sides of the body and being thin strips extending from the body.

8. The shielding member of claim 1, further comprising a blocking flange formed on the operational portion and away from an edge of the body.

* * * * *